United States Patent
Towata et al.

(10) Patent No.: US 6,245,442 B1
(45) Date of Patent: Jun. 12, 2001

(54) METAL MATRIX COMPOSITE CASTING AND MANUFACTURING METHOD THEREOF

(75) Inventors: Shinichi Towata; Nobuo Kamiya; Hiroshi Hohjo; Naohisa Nishino, all of Aichi-gun; Tsuyoshi Yamamoto, Kariya; Shoichi Onda, Toyokawa, all of (JP)

(73) Assignee: Kabushiki Kaisha Toyota Chuo, Aichi-Gun (JP)

( * ) Notice: Subject to any disclaimer, the term of this patent is extended or adjusted under 35 U.S.C. 154(b) by 0 days.

(21) Appl. No.: 09/084,396

(22) Filed: May 27, 1998

(30) Foreign Application Priority Data

May 28, 1997 (JP) .................................................. 9-155823
Oct. 21, 1997 (JP) .................................................. 9-288938
Feb. 26, 1998 (JP) ............................................... 10-064613
Mar. 20, 1998 (JP) ............................................... 10-072690

(51) Int. Cl.$^7$ .............................. C22C 1/10; B22D 19/14

(52) U.S. Cl. .................... 428/614; 428/596; 428/600; 428/653; 428/469; 361/704; 361/719; 257/707; 257/717; 257/720

(58) Field of Search ................................. 428/614, 596, 428/653, 609, 612, 600, 469; 361/704, 719, 699, 689; 257/706, 707, 710, 714, 717, 720, 722

(56) References Cited

U.S. PATENT DOCUMENTS

| 4,407,136 | * | 10/1983 | De Kanter . | |
| 5,143,795 | * | 9/1992 | Das et al. | 428/614 |
| 5,176,857 | * | 1/1993 | Stacey et al. | 264/14 |
| 5,222,542 | * | 6/1993 | Burke | 164/97 |
| 5,234,045 | | 8/1993 | Cisko . | |
| 5,311,920 | * | 5/1994 | Cook . | |
| 5,313,098 | * | 5/1994 | Tumpey et al. . | |
| 5,337,803 | * | 8/1994 | Divecha et al. . | |
| 5,439,750 | * | 8/1995 | Ravenhall et al. | 428/614 |
| 5,469,617 | * | 11/1995 | Thomas et al. | 29/889.21 |
| 5,505,248 | * | 4/1996 | Aghajanian et al. | 164/97 |
| 5,526,867 | * | 6/1996 | Keck et al. . | |
| 5,533,257 | * | 7/1996 | Romero et al. . | |
| 5,570,502 | | 11/1996 | Sawtell et al. . | |
| 5,616,421 | | 4/1997 | Sawtell et al. . | |
| 5,616,886 | * | 4/1997 | Romero et al. . | |
| 5,620,791 | * | 4/1997 | Dwivedi et al. | 428/323 |

(List continued on next page.)

FOREIGN PATENT DOCUMENTS

| 59-070457 | 4/1984 | (JP) . |
| 61-067560 | 4/1986 | (JP) . |
| 62-207474 | 9/1987 | (JP) . |
| 63-256259 | 10/1988 | (JP) . |
| 1-224159 | 9/1989 | (JP) . |
| 6-036980 | 5/1994 | (JP) . |

OTHER PUBLICATIONS

Yamaguchi et al: "Developing CMC and MMC material by Lanxide method", an offprint from Ceramic Databook '95, 1995, pp. 95–101 no month.

*Primary Examiner*—Deborah Jones
*Assistant Examiner*—Jason Savage
(74) *Attorney, Agent, or Firm*—Pillsbury Winthrop LLP

(57) ABSTRACT

A metal matrix composite casting comprises a metal matrix composite and a processed member inserted in the metal matrix composite by enveloped casting. By the processed member which is easier to process than the metal matrix composite, a processed portion of a predetermined shape can be formed in the metal matrix composite. That is, by a simple processing such that the processed member is removed from the metal matrix composite or the processed portion is formed in the processed member itself, the processed portion having a desired shape can be easily formed in the metal matrix composite.

4 Claims, 6 Drawing Sheets

U.S. PATENT DOCUMENTS 5,657,811 * 8/1997 Cook .
5,662,157 * 9/1997 Cook .
5,672,433 * 9/1997 Cook .
5,981,085 * 11/1999 Ninomiya et al. .................. 428/614

* cited by examiner

METAL MATRIX COMPOSITE CASTING AND MANUFACTURING METHOD THEREOF

CROSS REFERENCE TO RELATED APPLICATION

This application is based upon and claims the benefit of priority from Japanese patent applications No. H. 9-155823 filed on May 28, 1997, No. H.9-288938 filed on Oct. 21, 1997, No. H.10-64613 filed on Feb. 26, 1998, and No. H.10-72690 filed on Mar. 20, 1998, the contents of which are incorporated herein by reference.

BACKGROUND OF THE INVENTION

1. Field of the Invention

The present invention relates to a metal matrix composite casting in which particles, fibers, short fibers, whiskers or the like of, for example, ceramic are dispersed and a manufacturing method thereof.

2. Related Art

Metal matrix composites are materials formed by dispersing a property-improving materials such as particles and fibers in a metal serving as a host material. As one example of the metal matrix composites, there is an aluminum matrix composite in which ceramic particles are dispersed in aluminum. In a manufacturing process of the aluminum matrix composite, a preform of the ceramic particles is disposed in a casting metal mold and is incorporated within aluminum by die-casting.

The aluminum matrix composite is used, for example, as a part functioning as a heat-sink for a semiconductor power module. For a metal matrix composite functioning as a heat-sink, an aluminum-silicon carbide (Al-SiC) composite is generally used. Because of the necessity of mounting an IC substrate on the heat-sink, the heat-sink must be subject to a secondary process such as a surface finishing process and a hole forming process. However, since the Al-SiC composite is very hard, it is difficult to carry out the secondary process with respect to the Al-SiC composite, and therefore, the cost thereof becomes high.

In view of the problem discribed above, a method in which the surface of the Al-SiC composite is processed by utilizing an Al layer formed in the surface thereof at the time of manufacturing the Al-SiC composite has been proposed. U.S. Pat. No. 5,234,045, U.S. Pat. No. 5,570,502, U.S. Pat. No. 5,616,421)

In this method, however, since the formed Al layer is thin, the process of making the Al-SiC composite is difficult due to the influence of the underlying Al-SiC composite.

SUMMARY OF THE INVENTION

The present invention has been made in view of such problems, and its object is to provide a metal matrix composite casting having a superior processability and a manufacturing method thereof.

In order to attain such an object, the metal matrix composite casting according to the present invention comprises a metal matrix composite, and a processed member inserted in the metal matrix composite by enveloped casting. By the processed member, a processed portion of a predetermined shape can be formed in the metal matrix composite.

That is, because the processed member is inserted in the metal matrix composite, by a simple processing such that the processed member is removed from the metal matrix composite, the processed portion having an approximately equal or similar shape with that of the processed member can be formed in the metal matrix composite. In this case, it is preferable to apply a mold release agent on the surface of the processed member. Due to this, the processed member can be removed from the metal matrix composite by a small force added thereto. As the mold release agent, carbon, boron nitride and so on can be used.

Alternatively, the processed member may be left in the metal matrix composite, and the processed portion may be formed in the processed member by a processing method such as cutting and drilling. In this case, the processed portion can be easily formed into a desired shape.

When the processed portion is formed in the processed member, it is desirable that the periphery of the processed portion is surrounded by the processed member. In this case, because the processability of the processed member is better than that of the metal matrix composite, the processed portion having a complicated shape such as a screw thread can be easily formed. Further, even if cracks occur in the processed member during formation of the screw thread, they do not reach the metal matrix composite. If the cracks are formed in the metal matrix composite, the metal matrix composite may break with the cracks becoming the starting points.

For example, a hole is formed as the processed portion. The hole can be used as a screw hole to which a bolt is fastened. The processed portion may taper away. Also, the surface of the processed portion may be flat or curved.

When the processed portion tapers away, by adding a force to the processed member from a taper-narrowing side of the processed portion to a taper-spreading side thereof, the processed member can be readily taken away from the processed portion.

Preferably, the difference in coefficient of thermal expansion between the processed member and the metal matrix composite is equal to or lower than $10 \times 10^{-6}$/K. As a result, even though the metal matrix composite and the processed member inserted thereinto are exposed to temperature variation, the processed member can be prevented from separating from the metal matrix composite.

Alternatively, by increasing an interface strength between the processed member and the metal matrix composite also, high-quality metal matrix composite casting can be manufactured. To increase the interface strength, the processed member itself or the surface of the processed member is formed from a material which is easily wettable with the metal of the metal matrix composite. Or, by forming minute projections on the surface of the processed member, mechanical bonding strength between the processed member and the metal matrix composite may be increased.

Preferably, the processed member is formed from cast iron and the metal matrix composite is an Al-SiC composite. In this case, the difference in coefficient of thermal expansion between the processed member and the metal matrix composite becomes small. In addition to that combination, the processed member and the metal matrix composite as described later can be used.

The metal matrix composite is formed by mixing the characteristic improving material with the metal serving as a host material.

The metal in the metal matrix composite is preferably one of elements that infiltrates into the processed member under high temperature and high pressure due to die-casting. As a result, the processed member is inserted in the metal matrix composite by enveloped casting, and the strength of the processed portion can be enhanced. Aluminum, aluminum alloys, magnesium, magnesium alloys, copper, copper alloys, zinc and zinc alloys can be used as the metal of the metal matrix composite.

The characteristic improving material is mixed to improve the characteristics of the metal of the metal matrix composite. Therefore, depending on the characteristics of the metal to be improved, the property, composition, form of the characteristic improving material are changed. The characteristic improving material is in a form of particle, fiber, short fiber or whisker. Silicon carbide (Sic), carbon, aluminum nitride (AlN), aluminum oxide ($Al_2O_3$), beryllium oxide (BeO), copper, silicon nitride, diamond and the like can be used as the characteristic improving material.

When the molten metal is poured into the cavity of the casting mold filled. with the characteristic improving material, the metal with which the characteristic improving material has been mixed in advance can be poured into the cavity.

The metal matrix composite casting can be manufactured by the following method. That is, the method includes a step of disposing a processed member in a cavity of a casting mold, a step of filling the inside of the cavity with a characteristic improving material, a step of pouring metal into the cavity by pressure-casting, thereby forming a metal matrix composite composed of the characteristic improving material and the metal, and a step of forming a processed portion of a predetermined shape by using the processed member.

According to this method, the metal matrix composite is pressure-cast in a state that the characteristic improving material is dispersed in the metal serving as a host material. In addition, the processed member preset in the casting mold is inserted in the metal matrix composite by enveloped casting. In this way, it is possible to obtain the metal matrix composite casting in which the processed member is inserted in the metal matrix composite by enveloped casting.

In this structure, by a simple processing such as stamping and chasing to remove the processed member, the processed portion having an approximately equal or similar shape with that of the precessed member can be formed in the metal matrix composite. That is, the manufacturing method according to the present invention has a superior processability.

The processed member is formed from an easily processable material. However, the melting point of the processed member must be higher than that of the molten metal at the time of die-casting to maintain the shape thereof even during die-casting. The processed member having such characteristics is preferably formed from water-soluble salt, metal, a preform of metal powder, metal foaming body, metallic fiber textile, metallic fiber non-woven cloth, carbon or boron nitride fiber textile, carbon or boron nitride non-woven cloth, or a preform of carbon or boron nitride powder. As a result, the process of the processed member can be made easily.

The above-mentioned pressure-casting includes high-pressure casting and die-casting.

The metal matrix composite casting according to the present invention has wide application such as a heat-sink for a power module, a package, an electrical part for a heat exchanger, a mechanical part for an engine piston.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

PREFERRED EMBODIMENTS OF THE INVENTION

The present invention will be described based on preferred embodiments.

(First Embodiment)

A metal matrix composite casting according to a first embodiment will be described with reference to FIG. 1 to FIGS. 3A–3C.

Figure 1:
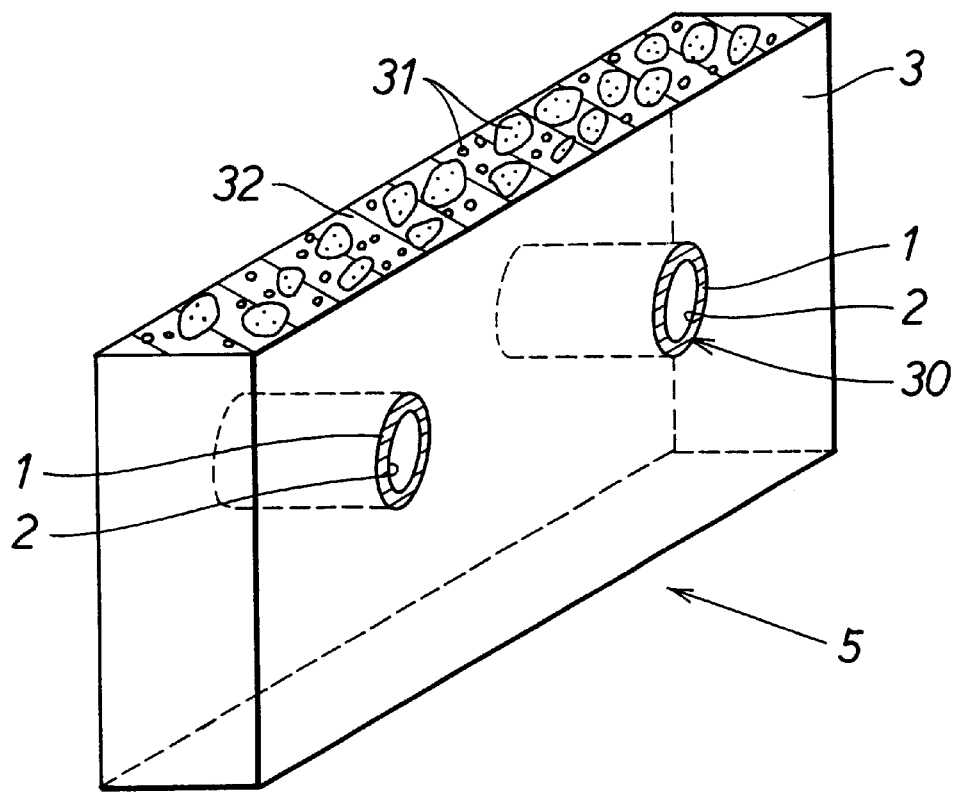
FIG. 1 is a perspective schematic view of a metal matrix composite casting according to a first embodiment of the present invention.

The metal matrix composite casting 5 is, as shown in FIG. 1, constructed from a metal matrix composite 3, and a processed member 1 inserted at a processed position 30 in the metal matrix composition 3. A processed portion 2 of a predetermined shape is formed in the processed member 1 provided at the processed position 30.

The metal matrix composite 3 is formed from aluminum alloy (hereinafter, referred to as "Al alloy") 32 and a silicon carbide powder 31. A thermal expansion coefficient of the metal matrix composite 3 is $7 \times 10^{-6}$/K. The metal matrix composite 3 is a plate of 150 mm×240 mm in size and its thickness is 2.5 mm.

The processed member 1 is formed from cast iron. A thermal expansion coefficient of the processed member 1 is $11 \times 10^{-6}$/K. The processed member 1 is a disc having a diameter of 7 mm and a thickness of 2.5 mm.

Figure 2:
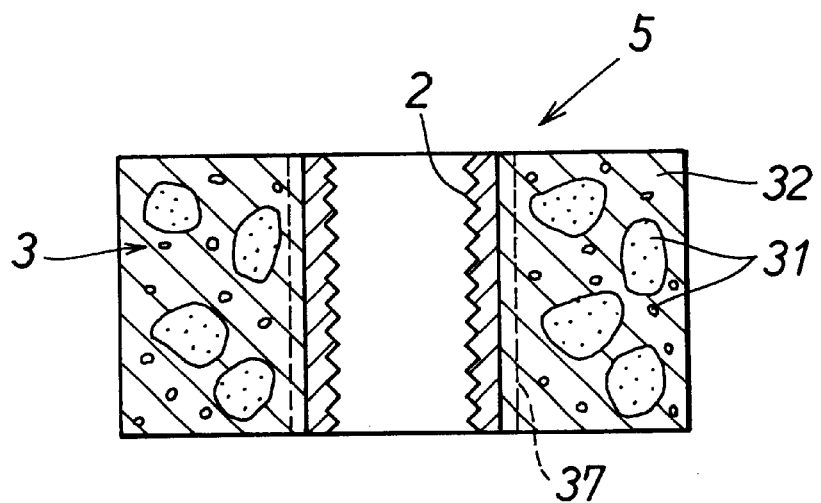
FIG. 2 is a sectional view showing a processed portion of the metal matrix composite casting.

As shown in FIG. 2, the processed portion 2 is a screw hole to which a bolt is fastened. The screw hole has the same axis as the processed member 1 and its diameter is 5 mm. The inner surface of the processed portion 2 is applied with a thread cutting. It is to be noted that Ni-resist cast iron (thermal expansion coefficient: $17 \times 10^{-6}$/K), carbon (thermal expansion coefficient: $3 \times 10^{-6}$/K), Fe—Ni (thermal expansion coefficient $1 \times 10^{-6}$/K) can be used as the processed member.

Next, the manufacturing method of the metal matrix composite casting will be described.

Figure 3A:
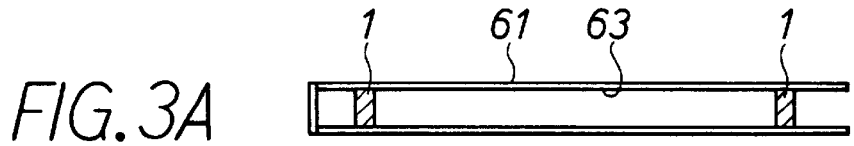
FIGS. 3A–3C are views showing a process of manufacturing the metal matrix composite casting.

First, as shown in FIG. 3A, a holder 61 made from steel is prepared. In the holder 61, a cavity 63 of 150 mm×240 mm×2.5 mm in size is provided. Then, a plurality of processed members 1 are arranged in the holder 61.

Figure 3B:
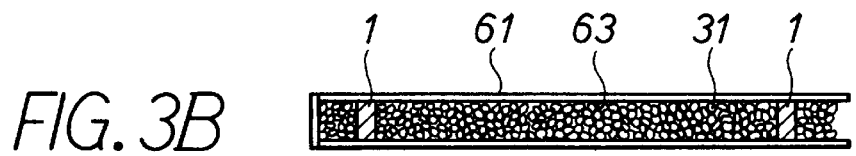

Next, as shown in FIG. 3B, silicon carbide (SiC) powder 31 having an average grain size of 100 μm is filled in the cavity 63. After that, the silicon carbide powder 31 is pressurized so that the volume of the silicon carbide powder 31 becomes 65% of the volume of the cavity 63. The holder 61 is heated up to 800° C. in an electric furnace.

Figure 3C:
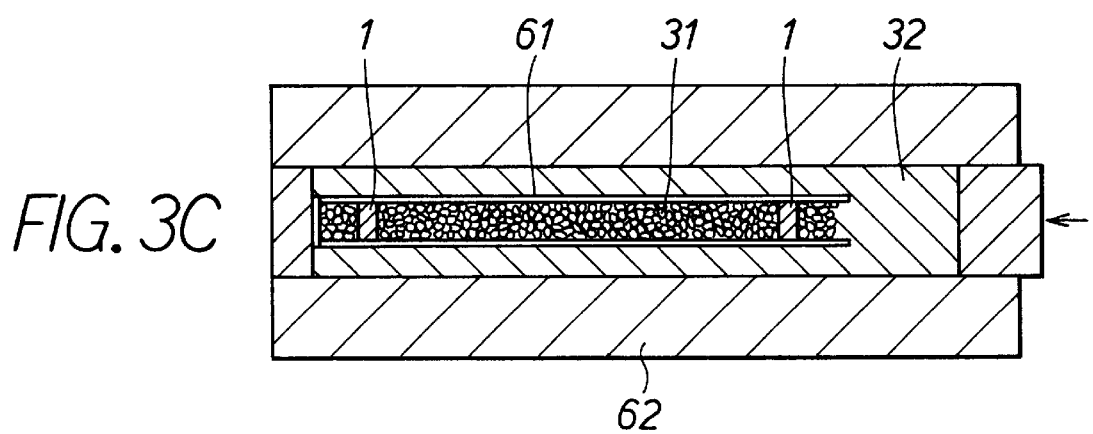

As shown in FIG. 3C, the heated holder 61 is disposed in a casting mold 62 preheated to 250° C. and, immediately after that, molten Al alloy 32 (for example Al-12% Si alloy) is poured thereinto. The molten Al alloy 32 poured into the casting mold 62 is pressurized to approximately 800 kg/cm$^2$ for 15 minutes.

After cooling, the metal matrix composite 5 composed of the Al alloy 32 and the silicon carbide powder 31 is taken out of the holder 61. As shown in FIG. 1, thread cutting is carried out in the processed member 1.

In the metal matrix composite 5, the processed member 1 being a disk made from cast iron is provided at the processed position 30. Because the processed member 1 is softer than the metal matrix composite 3, thread cutting can be easily carried out. It should be noted that an alloy layer 37 of the cast iron and the Al alloy 32 was formed in a periphery of the processed member 1.

Although the processed portion 2 was a screw hole to which a bolt is fastened, the whole processed member 1 may be removed by, for example, a drilling process so that a cylindrical penetration hole of the same shape as the processed member 1 is formed.

Further, although the processed member 1 is processed after casting in the above-mentioned embodiment, the processed member 1 can be processed before casting. For example, when a screw hole is to be formed, the processed member in which a hole has been formed is disposed in a holder 61 and then molten metal is poured into the holder 61. In this case, if the melting metal enters the hole of the processed member, the metal in the hole of the processed member is removed after casting.

(Second Embodiment)

Figure 4:
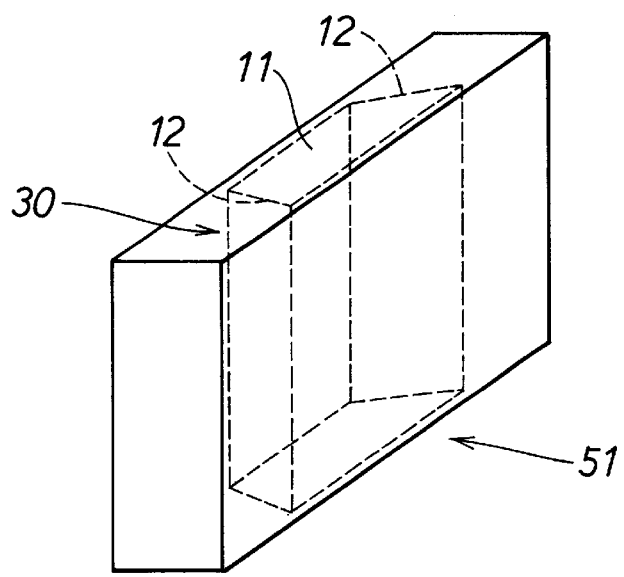
FIG. 4 is a perspective schematic view of a metal matrix composite casting according to a second embodiment of the present invention.
Figure 5:
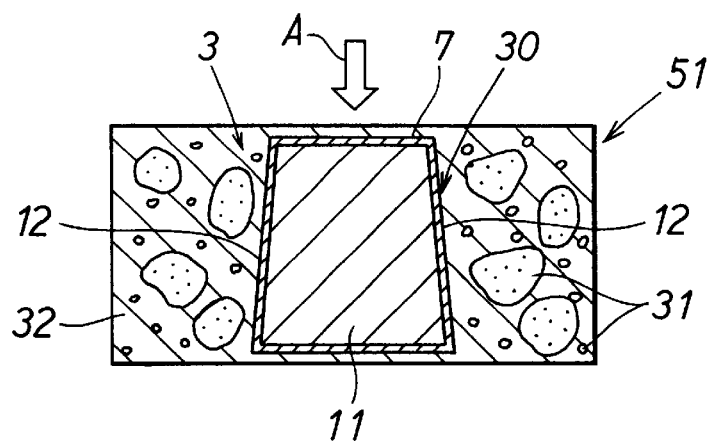
FIG. 5 is a sectional view of the metal matrix composite casting according to the second embodiment.

In a metal matrix composite casting according to a second embodiment, as shown in FIGS. 4 and 5, a processed member 11 tapers away in a direction of a plate thickness. That is, the processed member 11 is formed into a tapered shape 12. Also, the surface of the processed member 11 is applied with a mold release agent 7.

The processed member 11 is made from copper and its thermal expansion coefficient is 17×10$^{-6}$/K. The angle of the taper 12 in the direction of the plate thickness is 3°. The size of the processed member 11 is 15 mm×15 mm and its thickness is 5 mm. The mold release agent 7 applied on the surface of the processed member 11 is minute powder of boron nitride. The processed member 11 is inserted in the metal matrix composite 3 composed of the Al alloy 32 and the silicon carbide powder 31 by enveloped casting.

The size of the metal matrix composite casting 51 is 150 mm×240 mm and its thickness is 5 mm. The other structures and the manufacturing method thereof are the same as the metal matrix composite casting of the first embodiment.

In the second embodiment, the processed member 11 is formed into the tapered shape 12. Also, the surface of the processed member 11 is applied with the mold release agent 7. Therefore, by adding an external force A to the processed member 11 from a taper-narrowing side to a taper-spreading side, the processed member 11 is readily taken away from the processed position 30 of the metal matrix composite casting 51. As a result, the processed portion having a substantially same shape as the processed member 11 is formed at the processed position 30. In this way, the processed portion can be easily formed at the processed position 30 of the metal matrix composition casting 51. Further, the metal matrix composite casting 51 can obtain the same effects as the metal matrix composite casting 5 of the first embodiment.

(Third Embodiment)

In a third embodiment, a material made from water-soluble salt is used as the processed member. After pressure casting, a metal matrix composite casting is washed off with water to take away the processed member therefrom. In this way, the metal matrix composite casting is completed.

Specifically, the processed member is formed from rock salt. The processed member has a cylindrical shape of diameter 10 mm and height 20 mm. The other structures and the manufacturing method thereof are the same as the metal matrix composite casting of the first embodiment.

In this third embodiment, because the processed member can be easily taken away by washing it off with water, a penetration hole of diameter 10 mm can be easily formed in the metal matrix composite composed of silicon carbide and aluminum alloy.

(Comparative Example)

As a comparative example, a metal matrix composite casting was manufactured by filling the cavity of a casting mold with silicon carbide (SiC) powder and then by pouring molten aluminum alloy thereinto. The size and the like of the metal matrix composite casting are the same as those of the metal matrix composite casting of the first embodiment.

Although it was attempted to form a hole of diameter 10 mm in the manufactured metal matrix composite casting by using a normal drill, the hole could not be formed because of excessive abrasion of the drill.

(Fourth Embodiment)

Next, a fourth embodiment will be described with reference to drawings.

In the fourth embodiment, a metal matrix composite casting is applied to a heat sink (plate) 101 integrally provided with fins 111 (hereinafter, referred to as "heat sink 101") for radiating heat generated by a power module 102 that drives an inverter.

Figure 6:
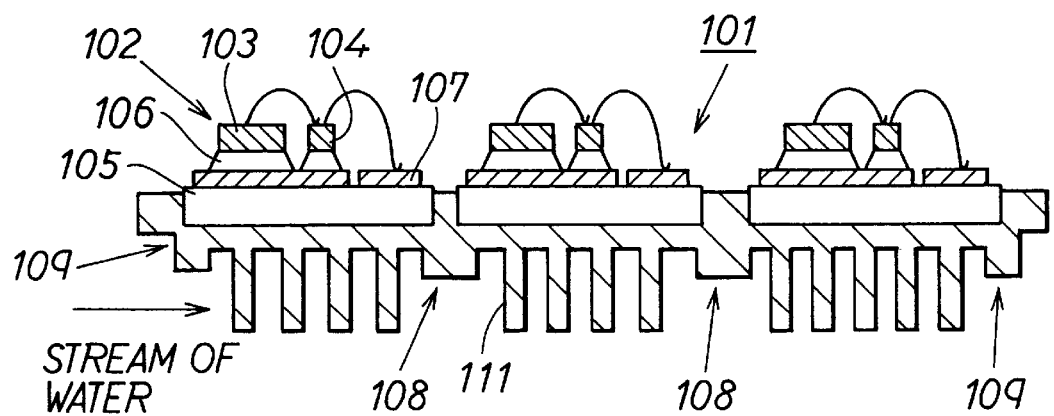
FIG. 6 is a sectional view of a power module 102 provided with a heat sink (plate) 101 according to a fourth embodiment of the present invention.

FIG. 6 shows a schematic sectional view of the power module 102 mounted on the heat sink 101.

The power module 102 is constructed by a plurality of insulated gate bipolar transistors (IGBTS) 103 and performs switching operation. A fly-wheel diodes (FWDS) 104 are provided to the power module 102. Due to this FWDs 104, the IGBTs 103 can perform switching operation so that current flows in both directions. Each pair of the IGBT 103 and the FWD 104 is mounted on respective insulating substrates 105 made from aluminum nitride (AlN) interposing solders 106 therebetween and is wire-bonded to copper wirings 107 provided on the insulating substrates 105.

Below the power module 102 thus constructed, there is the heat sink 101 formed from a metal matrix composite mixed with a ceramic dispersing material (characteristic improving material). The heat sink 101 radiates heat generated by the power module 102.

The plurality of insulating substrates 105 is joined onto the heat sink 101 in a state that a predetermined spacing between the adjacent insulating substrates 105 is ensured. In more detail, the plurality of insulating substrates 105 is integrated with the heat sink 101 by inserting the insulating substrates 105 into the heat sink 101 by enveloped casting when the heat sink 101 is cast. In this way, the heat sink 101 and the power module 102 are integrally formed.

Figure 7A:
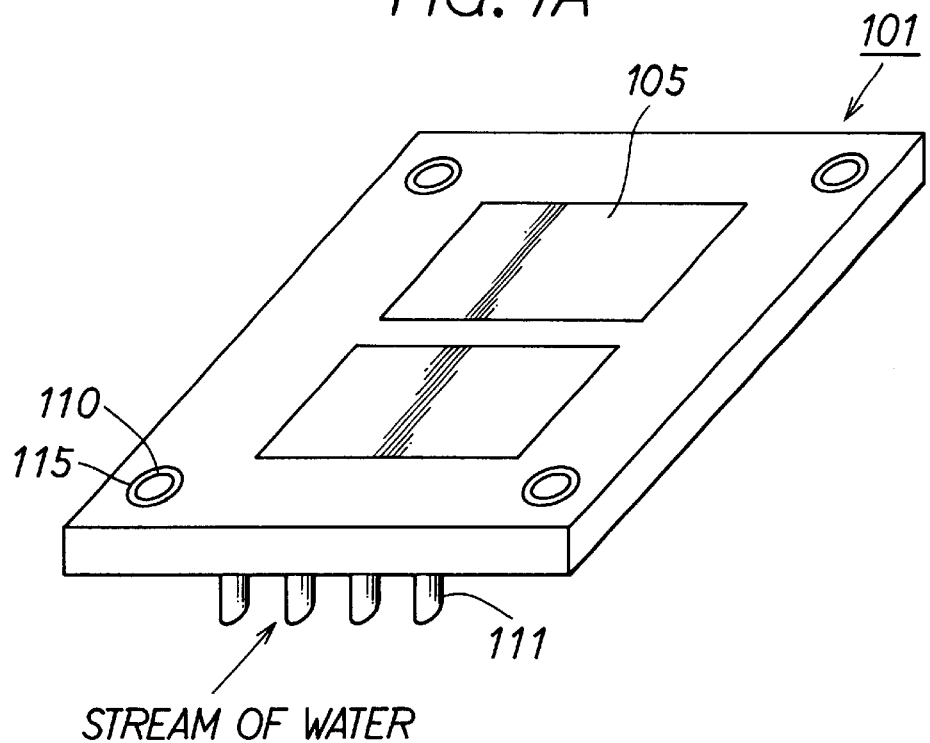
FIGS. 7A and 7B are perspective views of the heat sink 101.
Figure 7B:
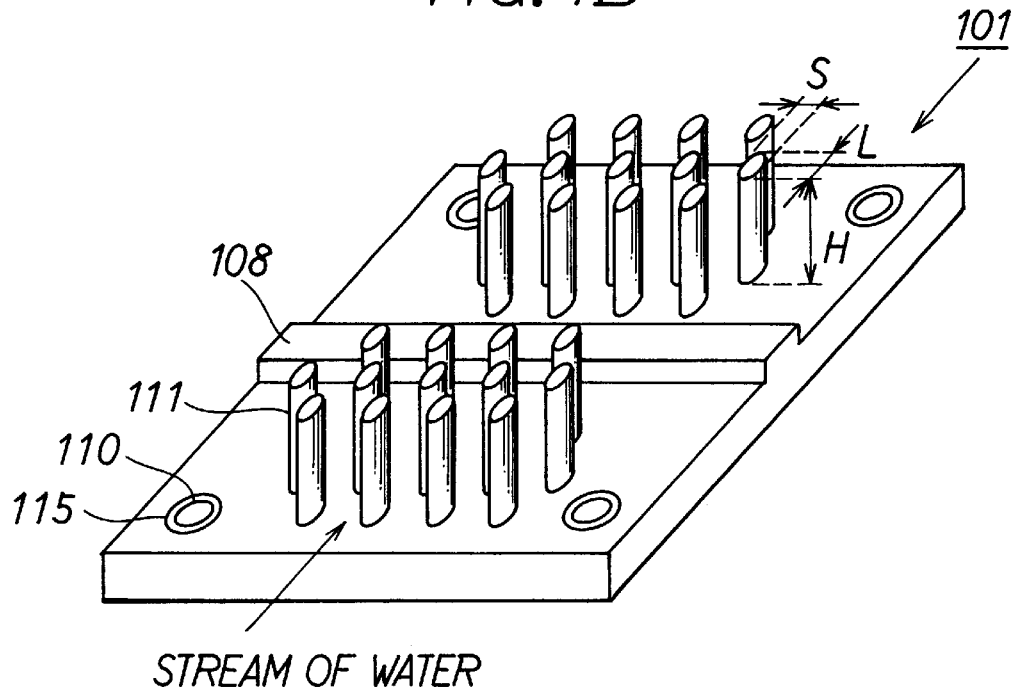

FIG. 7A shows a perspective view of the heat sink 101 into which the insulating substrates 105 are inserted, as viewed from an upper side of the heat sink 101. FIG. 7B shows a perspective view of the heat sink 101, as viewed from a lower side thereof. Note that, in FIGS. 7A and 7B, the heat sink 101 and the power module 102 with which two insulating substrates 105 are provided are shown for brevity's sake.

As shown in FIG. 7A, the insulating substrates 105 are disposed on an upper side of the heat sink 101 and are inserted into the heat sink 101 so that the upper surface of the insulating substrate 105 is on the same plane as the upper surface of the heat sink 101. At four corners of the heat sink 101 where the insulating substrate 105 is not disposed, screw holes for fastening use are formed. The screw holes are formed using metal materials inserted at the four corners when the heat sink 101 is cast.

As shown in FIG. 7B, on the lower surface of the heat sink 101, particularly at a place corresponding to the rear face of the insulating substrate 105, fifty numbers of fins 111 each of which has a projecting shape are formed. These fins 111 are immersed in a stream path of refrigerant such as water. As a result, heat exchange is carried out between the fins 111 and the refrigerant in such a manner that heat transmitted to the fins 111 is radiated to the refrigerant. It is to be noted that, when water is used as the refrigerant, the stream of water is shown by an arrow in FIGS. 6, 7A and 7B.

Each of the fins 111 is a pillar of which cross section is oval and height H is approximately 7 mm. The long diameter L of the oval shape is approximately 4 mm and its direction is in parallel to a stream direction of the refrigerant. The short diameter S of the oval shape is approximately 2 mm and its direction is in perpendicular to the stream direction of the refrigerant. In this way, by making the height H of the fin 111 longer than the long diameter L and the short diameter S of the oval shape, it is possible to increase heat radiating efficiency. The plurality of fins 111 is arranged in a staggered form. Because of shape and arrangement of the fins 111, the stream of the refrigerant is not disturbed by the fins 111.

At a place where the insulating substrates 105 are not disposed, thick plate portions 108 are formed in the heat sink 101 to suppress warp of the heat sink 101. Specifically, the heat sink 101 is formed so that the thickness thereof at the spacing between the insulating substrates 105 is thicker by, for example, 2 mm than that of the other place. That is, stress is caused by the difference in quality of the material between the insulating substrate 105 and the heat sink 101, and the stress concentrates on the ends of the insulating substrate 105. Therefore, because warp of the heat sink 101 mostly occurs at the spacing between the insulating substrates 105, the warp of the heat sink 101 at the spacing must be suppressed.

When the thick plate portions 108 are formed, the longitudinal direction of the thick plate portion 108 is perpendicular to the stream direction of the refrigerant. In this case, grooves extending to the steam direction of the refrigerant may be formed in the thick plate portions 108 not to disturb the stream of the refrigerant.

Seal portions 109 having projections are formed at a periphery of the heat sink 101 to join the heat sink 101 with a refrigerant circulation case. The refrigerant circulation case causes cooled refrigerant to flow between the fins 111. Due to the seal portions 109, the heat sink 101 and the refrigerant circulation case are joined in fluid-tight. The shape of the seal portion 109 is not limited to the one shown in FIG. 6 and may be arbitrary.

Next, the manufacturing process of the heat sink 101 integrally provided with the insulating substrates 105 will be described with reference to FIGS. 8 to 11. It is to be noted that the heat sink 101 provided with one insulating substrate 105 is shown in FIGS. 8 to 11 for brevity's sake.

Figure 8:
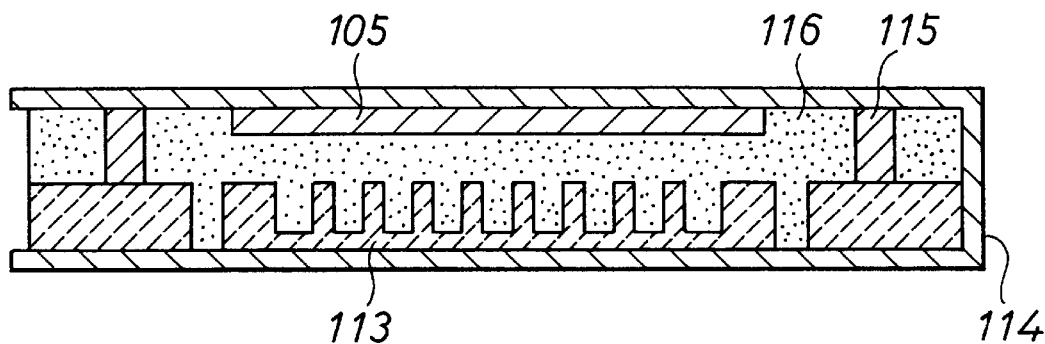
FIGS. 8 through 11 are sectional views illustrating the heat sink 101 in a manufacturing process.

[Process shown in FIG. 8]

First, a forming case 113 having cavities for forming the fins 111 on the heat sink 101 is formed. In detail, by pressurizing sodium chloride powder to a high pressure equal to or greater than 500 kg/cm$^2$, the forming case 113 of length 80 mm, width 50 mm, and thickness 10 mm is formed. Fifty oval holes as the cavities are formed in the forming case 113. After formation of the forming case 113, heat treatment may be carried out to increase the strength of the forming case 113. However, since the forming case 113 is formed under high pressure, the forming case 113 has an enough strength as it is.

The reason why the material for forming the forming case 113 is sodium chloride is that it is stable without being decomposed or dissolved under the temperature of the molten metal poured into the forming case 113 at a time of casting, it is easily dissolved or disintegrated in solvent in which the heat sink 101 is immersed after casting, and even if the shape of the heat sink 101 is intricate, the forming case 113 can be formed into an arbitrary shape corresponding to the shape of the heat sink 101.

Grain size of the sodium chloride powder used in this case can be changed depending on productivity, the strength of the forming case 113 and so on. In this embodiment, the sodium chloride powder having grain size of 50 Å to 0.5 μm is used to form the surface portion or the whole of the forming case 113 to make the face to be contacted with the heat sink 101 smooth. Sodium chloride has purity of degree to which the temperature of the melting point of the sodium chloride powder is higher than that of the metal used in high-pressure casting and the sodium chloride power does not melt at a pre-heated temperature of a steel casing 114 in which the ceramic dispersing material is filled.

Next, the steel casing 114 is prepared and the forming case 113 is attached on a first surface inside the steel casing 114. The insulating substrate 105 is also attached on a second surface opposing to the first surface. Further, steel sheets 115 for forming the screw holes 110 are disposed at places that become four corners of the heat sink 101. As a result, an inner space to form the heat sink 101 integrally provided with the fins 111 is produced inside the steel casing 114.

Thereafter, silicon carbide powder 116 serving as the ceramic dispersing material is filled in the inner space of the steel casing 114. Thermal expansion coefficient of silicon carbide is close to that of the insulating substrate 105 formed from AlN. Therefore, when the insulating substrate 105 is built in the heat sink 101, warp of the heat sink can be suppressed. Also, silicon carbide has a high heat conductivity and is superior in heat dissipation characteristic.

Grain size and filling quantity of the silicon carbide powder 116 may be changed depending on characteristics required to the metal matrix composite forming the heat sink 101. When the filling quantity of the silicon carbide powder 116 is increased, a mixture of fine powder and coarse powder is preferably used. In this embodiment, the silicon carbide powder 116 in which the powder of average grain size 20 μm and the powder of average grain size 100 μm are mixed and a ratio of the former to the latter is 30 weight % to 70 weight % is used. After the silicon carbide powder 116 is filled, pressure may be applied to the silicon carbide powder 116 prior to casting.

Figure 9:
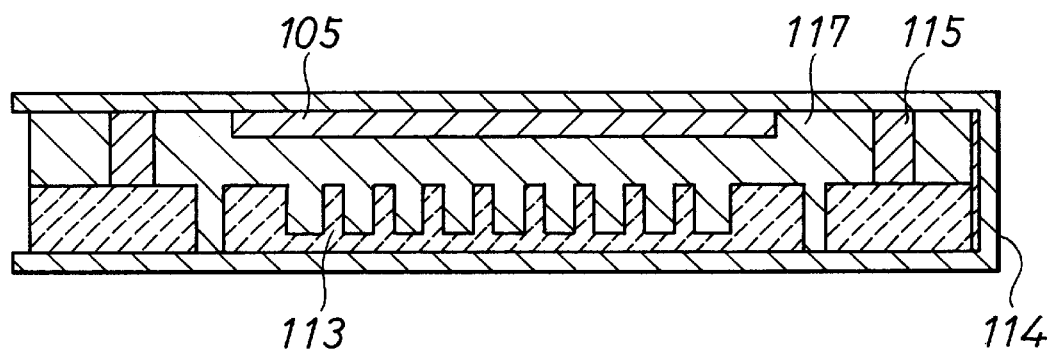

[Process shown in FIG. 9]

After the steel casing 114 in which the silicon carbide powder 116 has been filled is pre-heated at about 650° C., the steel casing 114 is disposed in a casting mold. Immediately after that, molten aluminum alloy (for example, Al-12%Si-0.3%Mg alloy) pre-heated at about 750° C. is poured in the casting mold. The molten aluminum alloy is pressurized by a pressure applying punch and is infiltrated into interstices of the silicon carbide powder 116 to form the metal matrix composite 117. Thereafter, the metal matrix composite 117 is solidified and cooled. As a result, an ingot in which the insulating substrates 105, steel sheets 115 for forming the screw holes and forming case 113 are inserted in the metal matrix composite 117 by enveloped casting is formed in the steel casing 114. After cooling, the ingot is taken out of the steel casing 114.

The reason why the molten aluminum alloy is used as a molten metal is that the temperature of the melting point of aluminum is low, and the forming case 113 made from sodium chloride does not melt at that temperature. In addition, since the thermal conductivity of the aluminum alloy is relatively high, the aluminum alloy is superior in heat radiation characteristics.

Figure 10:
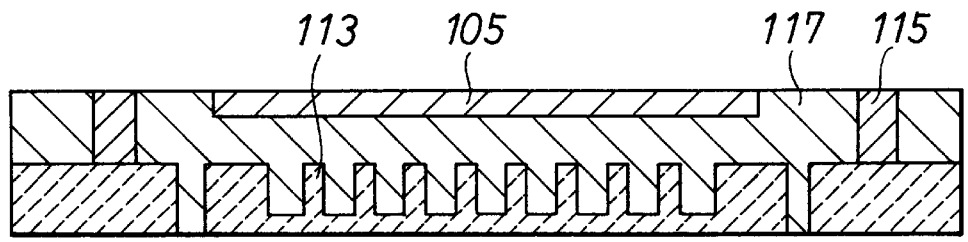

[Process shown in FIG. 10]

The metal matrix composite 117 is taken out of the steel casing 114 along with the insulating substrates 105, steel sheets 115 and forming case 113.

Figure 11:
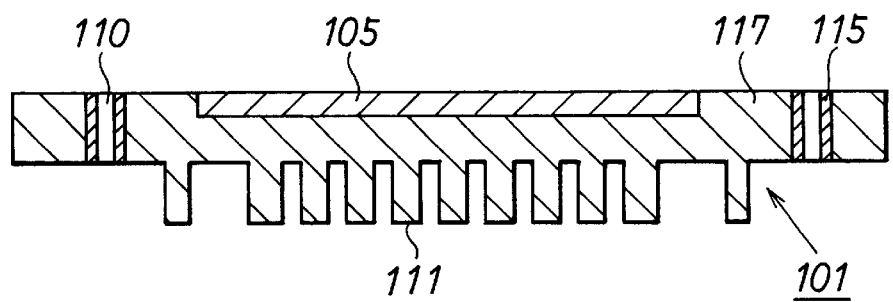

[Process shown in FIG. 11]

Unnecessary aluminum alloy is removed from the metal matrix composite 117, and the forming case 113 is washed off with water. Because the forming case 113 is made from sodium chloride, it is easily soluble in water. Therefore, the forming case 113 is completely removed by the above-mentioned water washing.

Thereafter, by forming screw holes 110 in the steel sheets 115 using a drill or the like, the heat sink 101 integrally provided with the fins 111 as shown in FIGS. 7A and 7B is completed.

As described above, since the forming case 113 is made from sodium chloride, it is possible to form it into a intricate shape. Further, the forming case 113 does not discompose or dissolve even at the temperature of the metal melting point and can be easily removed after casting. Therefore, it is possible to easily produce the heat sink 101 having an intricate shape.

Also, because grain size of sodium chloride is small, the surface of the forming case 113 can be made smooth. Therefore, the surfaces of the fins 111 are also made smooth. As a result, finish polishing process for smoothing the surfaces of the fins 111 can be dispensed with.

(Fifth Embodiment)

Figure 12:
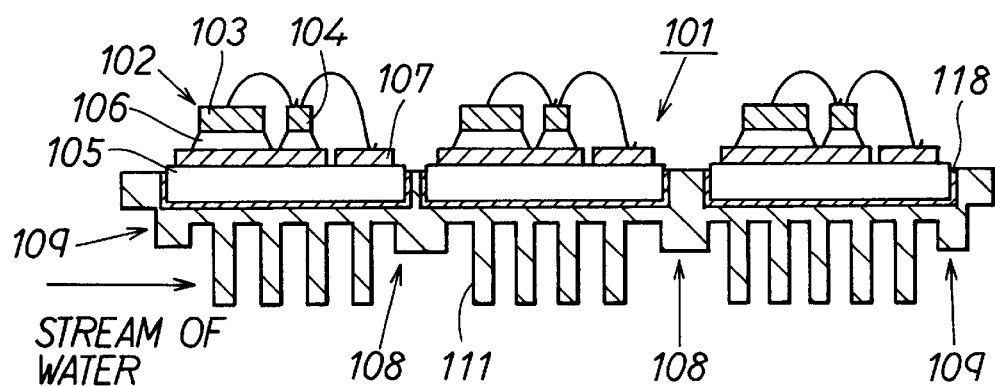
FIG. 12 is a sectional view of a power module 202 provided with a heat sink (plate) 201 according to a fifth embodiment of the present invention.

Next, a fifth embodiment will be described with reference to FIG. 12.

In this embodiment, yttrium serving as a sintering assisting agent is applied on the surface of an insulating substrates 105. After yttrium is applied, the insulating substrates 105 are attached on a surface inside the steel casing 114. The other structure of a power module 102 provided with a heat sink 101 and the manufacturing process thereof are the same as those of the power module 102 provided with the heat sink 101 according to the fourth embodiment.

When a metal matrix composite 117 is formed by high-pressure casting, aluminum alloy is impregnated into silicon carbide powder 116 serving as dispersing material for characteristic improving use by pressurizing molten metal with a hydrostatic pressure. As a result, the silicon carbide powder is compressed and thereby a certain clearance is created between the insulating substrate 105 and the silicon carbide powder 116. The aluminum alloy enters the clearance. Therefore, a metal layer 118 of aluminum alloy having a thickness of about 0.1 mm is interposed between the insulating substrate 105 and the metal matrix composite 117.

In this case, the area of the metal contacting to the insulating substrate 105 can be made larger, comparing to a case in which the insulating substrate 105 is directly bonded onto the metal matrix composite 117. Therefore, the bonding strength between the insulating substrate 105 and the metal matrix composite 117 can be enhanced.

Also, because the metal layer 118 is lower in Young's modulus than the metal matrix composite 117 (the Young' modulus of the metal matrix composite 117 formed from SiC/Al is about 260GPa while the Young's modulus of the metal layer 118 formed from Al is 70GPa), the metal layer 118 serves as a dumper between the metal matrix composite 117 and the insulating substrate 105 thereby further improving the bonding strength therebetween.

Also, because yttrium is applied on the surface of the insulating substrate 105, yttrium diffuses into the metal layer 118, a compound of yttrium, aluminum, silicon and the like is formed at an interface at which the insulating substrate 105 and the metal layer 118 are bonded. Due to the compound, the bonding strength of the insulating substrate 105 and the metal layer 118 can be enhanced.

It is to be noted that the thickness of the metal layer 118 can be controlled by adjustment of pressure added by the pressure applying punch.

In the above-mentioned fifth embodiment, yttrium serving as a sintering assisting agent is applied on the surface of the insulating substrate 105. However, yttrium may be added into the insulating substrate 105 prior to sintering of the insulating substrate 105. In this case, an amount of yttrium to be added is increased compared to the case in which yttrium is applied on the surface of the insulating substrate 105.

As the sintering assisting agent, in addition to yttrium, calcium, lithium, lanthanum and the oxides thereof can be used.

(Other Embodiments)

Although the silicon carbide powder 116 is used as the ceramic dispersing material, the material having characteristics of a high thermal conductivity and low thermal expansion may be used in addition to the silicon carbide powder 116. For example, graphite, carbon, copper, liquid crystal polymer (for example, polybenzothiazole (PBZT) such as KEVLAR, KEVLAR 29, and KEVLAR 49: Note that KEVLAR is a registered trademark of du Pont company with respect to synthetic aramide fiber of high strength and low density formed from poly-p-phenylene tereohthalamide (PPD-T)), silicon nitride, aluminum oxide, aluminum nitride, boron, boron carbide, boron/tungsten, boron carbide/tungsten, boron nitride, beryllium, beryllium oxide, fused silica, aluminum silicate (mullite), diamond, glass, cubic system boron nitride, boron silicate (silicon boride), oxide, nitride, carbide, boride, aluminum and the combination thereof can be used. Also, as a form of the ceramic dispersing material, whisker, fiber and so on can be used in addition to powder.

In the above-mentioned embodiments, aluminum alloy is used as a metal for forming the metal matrix composite. However, magnesium, copper, zinc and alloys based on each metal can also be used.

Further, although the forming case 113 is made from sodium chloride in the above-mentioned embodiment, in addition to sodium chloride, the forming case can be made from the material having characteristics such that it does not discompose or dissolve at the temperature of the metal melting point, and can be easily removed by dissolution or collapse after casting.

Because the metal matrix composite 117 is difficult to process, the steel sheets 115 are used for forming the screw holes in the above-mentioned fourth embodiment. However, in addition to steel, the other kinds of metal, water-soluble salt, a preform of metal powder, metal foaming body, metallic fiber textile, metallic fiber non-woven cloth, carbon or boron nitride fiber textile, carbon or boron nitride fiber non-woven cloth, or a preform of carbon or boron nitride powder can be used. As a result, the process to be required can be made easily.

In the above-mentioned embodiments, the cross section of the fin 111 is oval. However, the cross section of the fin 111 is not limited to this and may be a shape of a circle. However, to enhance the efficiency of heat exchange without disturbing the stream of the refrigerant, it is preferable to adopt fins having a cross section of oval or ellipse.

Further, the heat sink 101 can be formed by die casting by which powder-like ceramic dispersing material 116 is formed in a solid state beforehand.

What is claimed is:

1. A metal matrix composite casting comprising:

a metal matrix composite; and a processed member inserted in the metal matrix composite by enveloped casting to form a processed portion in the metal matrix composite, wherein the processed member is formed from cast iron and the metal matrix composite is an Al-SiC composite.

2. A metal matrix composite casting comprising:

a heat sink having a first surface with an electrical component to generate heat mounted thereon;

a plurality of fins provided on a second surface of the heat sink to radiate heat generated by the electrical component; and an insulating substrate inserted in the heat sink on the first surface thereof by enveloped casting, the insulating substrate electrically insulating the electrical component from the heat sink, wherein the plurality of fins is integrally formed on the heat sink and both the heat sink and the fins are formed of a metal matrix composite, and wherein the insulating substrate and the heat sink have a compound of a sintering assisting agent and a metal of the metal matrix composite interposed therebetween.

3. A metal matrix composite casting comprising:

an insulating substrate having a first surface with an electrical component to generate heat mounted thereon;

a metal matrix composite on which the insulating substrate is disposed at a second surface thereof; and a compound layer including a metal of the metal matrix composite and a sintering assisting agent, which is interposed between the insulating substrate and the metal matrix composite.

4. A metal matrix composite casting according to claim 3, wherein the sintering assisting agent is at least one of yttrium, calcium, lithium, lanthanum and oxides thereof.

* * * * *

UNITED STATES PATENT AND TRADEMARK OFFICE
CERTIFICATE OF CORRECTION

PATENT NO.   : 6,245,442 B1  
DATED        : June 12, 2001  
INVENTOR(S)  : Towata et al.

It is certified that error appears in the above-identified patent and that said Letters Patent is hereby corrected as shown below:

<u>Title page,</u>  
Item [73], please add -- 1st Assignee: DENSO Corporation, Kariya-City (JP) --

Signed and Sealed this

Fifth Day of February, 2002

Attest:

JAMES E. ROGAN  
*Director of the United States Patent and Trademark Office*

*Attesting Officer*